(12) United States Patent
Lloyd et al.

(10) Patent No.: US 7,764,568 B2
(45) Date of Patent: Jul. 27, 2010

(54) BUCKET BRIGADE ADDRESS DECODING ARCHITECTURE FOR CLASSICAL AND QUANTUM RANDOM ACCESS MEMORIES

(76) Inventors: Seth Lloyd, 18 Weston Rd., Wellesley, MA (US) 02482; Vittorio Giovannetti, 4 Via Isola di Montecristo, Pisa (IT) I-56122; Lorenzo Maccone, Via Jervis 100, Ivrea (IT) 10015

( * ) Notice: Subject to any disclaimer, the term of this patent is extended or adjusted under 35 U.S.C. 154(b) by 195 days.

(21) Appl. No.: 12/166,307

(22) Filed: Jul. 1, 2008

(65) Prior Publication Data

US 2009/0010090 A1    Jan. 8, 2009

Related U.S. Application Data

(60) Provisional application No. 60/947,719, filed on Jul. 3, 2007, provisional application No. 60/951,788, filed on Jul. 25, 2007.

(51) Int. Cl.
G11C 8/00    (2006.01)
(52) U.S. Cl. ............................. 365/230.06; 365/230.08
(58) Field of Classification Search ............ 365/230.06, 365/230.08, 230.02
See application file for complete search history.

(56) References Cited

U.S. PATENT DOCUMENTS

| 4,833,677 | A | 5/1989 | Jarwala et al. |
| 5,784,330 | A * | 7/1998 | Beck et al. ............. 365/230.06 |
| 6,529,396 | B2 * | 3/2003 | Hammond ................... 365/63 |
| 7,349,288 | B1 * | 3/2008 | Montoye et al. ....... 365/230.06 |
| 7,366,031 | B2 * | 4/2008 | Hachmann ............. 365/189.02 |
| 2004/0078421 | A1 | 4/2004 | Routt |
| 2005/0059167 | A1 | 3/2005 | Vitaliano et al. |
| 2007/0047370 | A1 | 3/2007 | Hachmann |
| 2007/0124532 | A1 | 5/2007 | Bennett |

* cited by examiner

*Primary Examiner*—Anh Phung
(74) *Attorney, Agent, or Firm*—Law Offices of Paul E. Kudirka

(57) ABSTRACT

In an address signal decoder for a RAM memory, address signals are decoded in a "bucket brigade" address decoding architecture in which the address signals or bits are sequentially sent along the same address decoding path. The inventive architecture comprises a set of node switches linked into a binary tree. The address signals enter at the root node of the binary tree. As each address signal reaches a node switch at the end of the path, it sets the path direction for that switch node so that subsequent address signals that follow the path will use that path direction. The decoder can be used with classical or quantum RAM memories.

23 Claims, 4 Drawing Sheets

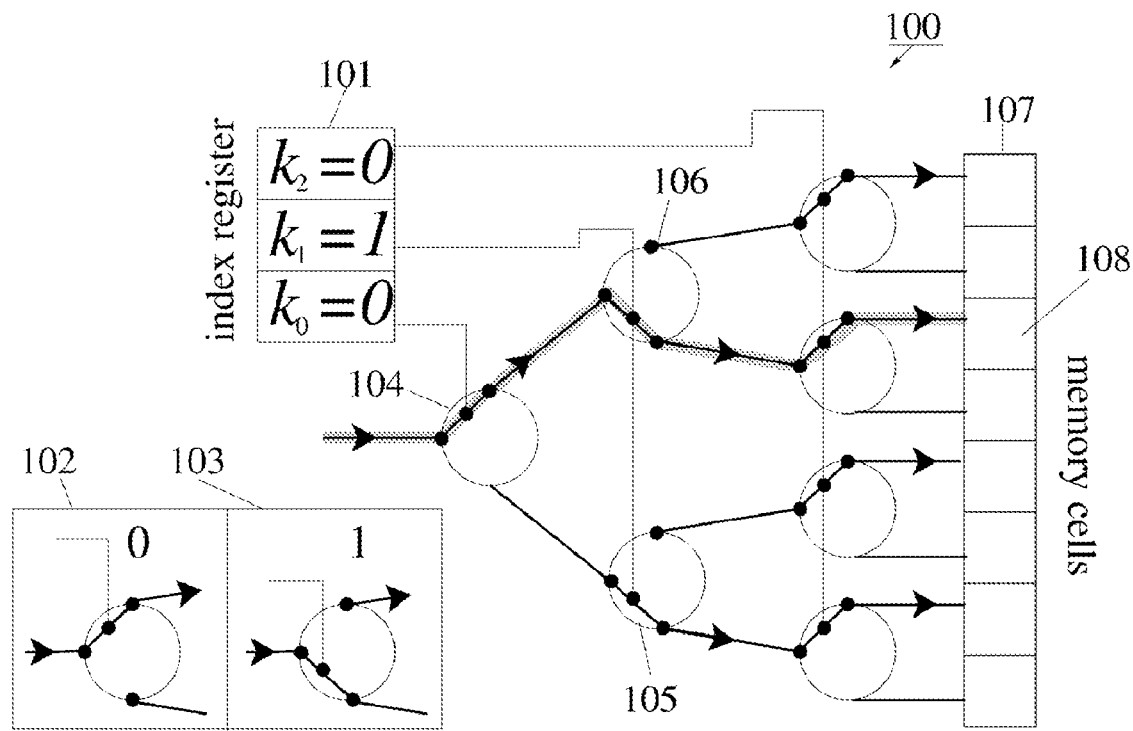
FIG. 1 *(Prior Art)*
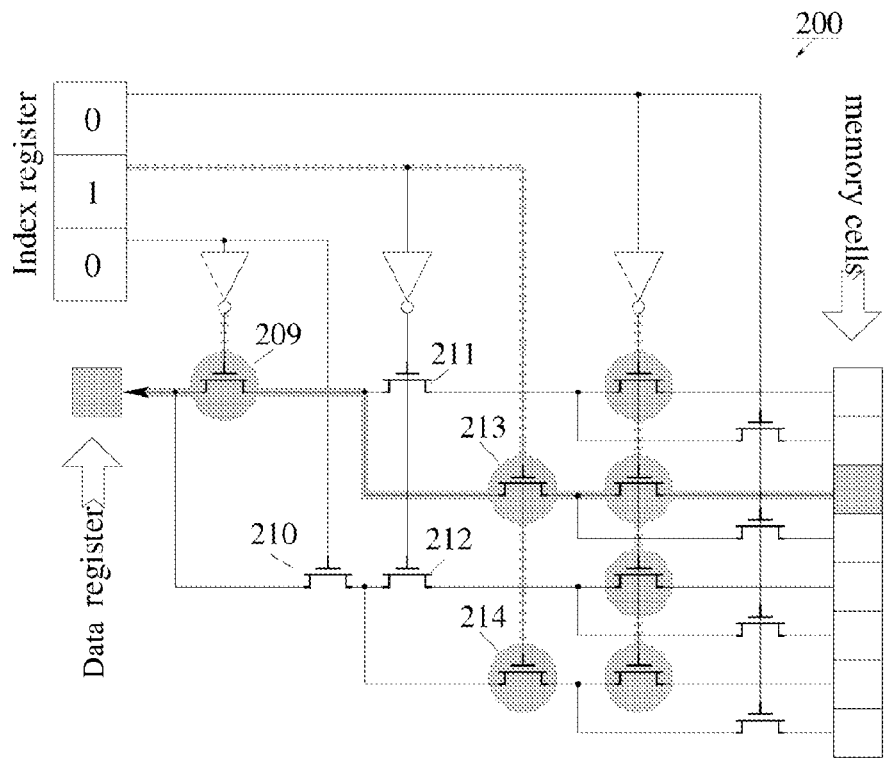
FIG. 2 *(Prior Art)*

BUCKET BRIGADE ADDRESS DECODING ARCHITECTURE FOR CLASSICAL AND QUANTUM RANDOM ACCESS MEMORIES

BACKGROUND

This invention relates to random access memory architectures, both classical and quantum. More particularly, it deals with apparatus and methods for reducing the number of physical interactions needed to address a random memory cell in an array of cells. A fundamental ability of any computing device is the capacity to store information in an array of memory cells. The most flexible architecture for memory arrays is random access memory, or RAM, in which any memory cell can be addressed at will. A RAM is composed of a memory array, an input register (called an "index register"), and a data register. Each cell of the array is associated with a unique numerical address. In a read operation, when the index register is initialized with the address of a memory cell, the content of the cell is returned at the data register (an operation called "decoding"). This can be expressed as:

$$\text{Input (index register)} = j \rightarrow \text{Output} = D_j \qquad (1)$$

where $D_j$ is the content of the jth memory cell. A "write" operation is entirely analogous: the contents of the data register are stored in the memory cell indexed by the index register. For clarity, in the following discussion only the "read" operation will be described with the understanding that the "write" operation is analogous.

Conventional address decoders use binary trees of decoding switches that allow the bits of the address to pick out a particular wire. For a two-dimensional memory array, the number of decoding switches that are activated in the course of a single memory access is on the order of the square root of the number of memory slots: $O(2^{(n/2)})$ decoding switches are activated to pick out the addressing wire on one side of the array, and another $O(2^{(n/2)})$ decoding switches are activated to pick out the addressing wire on the other side of the array.

In particular, if the index register contains the desired address in binary form, each bit of the register can be interpreted as a direction for the data signal to take at a bifurcation of a binary tree. Since the n bits encode the directions to take at n bifurcations, then $2^n$ different paths can be described this way.

A realization 100 of the conventional addressing procedure is shown in FIG. 1. Suppose that the N memory cells are placed at the end of a bifurcation graph, composed by the n levels, such as the one depicted in FIG. 1, where the first level is composed by the switch 104, the second level by 105 and 106, and so on. The value of the jth bit in the index register can be interpreted as the route to follow when one has reached a node in the jth level of the graph. If the value is 0, the upper path must be followed 102; if it is 1, the lower path must be followed 103 (for example, an index register 010 . . . is interpreted as "up" at the first level, "down" at the second level, "up" at the third, etc.). Each of the N possible values of the index register thus indicates a unique route that crosses the whole graph and reaches one of the memory cells 107. Therefore, a d-dimensional RAM consists of d such graphs, each addressing one side of a $N^{1/d} \times N^{1/d} \times \ldots$ array. This is sometimes called a "fanout" RAM addressing scheme, since each index bit "fans out" to control several decoding switches placed on different nodes of the binary decoder tree.

Fanout schemes are commonly implemented in RAM chips (see, for example, T. N. Blalock and R. C. Jaeger, *Microelectronic circuit design*, Cambridge Univ. Press, Cambridge, 2000) by translating them into electronic circuits where the switches of the binary tree are replaced by pairs of transistors as illustrated in FIG. 2. This prior art electronic implementation requires placing one transistor in each of the two paths following each node in the graph. All the transistors in the upper paths (for example, paths 209, 211 and 212) are activated if the corresponding index bit is zero and all the transistors in the lower paths (for example, paths 210, 213 and 214) are activated if the corresponding index bit is one. For every state of the index register, only one out of the $2^n$ possible paths has all the switches in a "conducting" state. Therefore, a signal will follow the path to the memory cell that the index register is addressing.

Since each index register bit controls all the transistors in one of the graph levels, an exponential number of transistors must be activated at each memory call to route the signals through the graph and this entails an energy cost exponentially larger than the cost of a single transistor activation. The main drawback of the fanout architecture is that it requires simultaneous control over all the $2^n-1$ nodes of the binary tree even though only n nodes directly participate to the addressing of a given memory cell (these are the switches which lie along the path to the addressed memory cell).

The number of active transistors can be reduced to O(n) by modifying the aforementioned arrangement. In particular, in FIG. 3, the fanout RAM architecture is modified to attain a circuit where, at each level of the binary tree, only two transistors are activated (for example, transistors 304 and 305 at the third level of the graph), and where at the final stage only a single transistor 309 is activated to open up the unique path to the desired memory slot. In total only 2n+1 transistors are activated for every memory call.

A quantum computer is a device that stores bits of information on individual quanta: one atom, one bit. Quantum bits (called "qubits"), have a counterintuitive feature that they can exist in a state of 0 and 1 simultaneously, a phenomenon called "quantum superposition". Quantum computers exploit quantum superposition to perform many computations simultaneously, in quantum parallel, with the qubit in the quantum computer existing in superpositions of 0 and 1 during the course of the computation. This ability of quantum computers to use quantum superpositions makes them in principle more powerful than conventional digital computers.

Just as a RAM forms an essential component of classical computers, quantum random access memory or qRAM will make up an essential component of quantum computers, should large quantum computers eventually be built. It has the same three basic components as the RAM, but the index and data registers are composed of qubits (quantum bits) instead of bits. The memory array can be either quantum or classical, depending on the qRAM's usage. The qRAM can then perform memory accesses in coherent quantum superposition (as described in M. A. Nielsen and I. L. Chuang. *Quantum Computation and Quantum Information*, Cambridge Univ. Pr., Cambridge, 2000). If a quantum computer needs to access a superposition of memory cells, the index register a must contain a superposition of addresses $$\sum_j \psi_j |j\rangle_a$$

and the qRAM will return a superposition of data in a data register d, correlated with the index register:

$$\sum_j \psi_j |j\rangle_a \xrightarrow{qRAM} \sum_j \psi_j |j\rangle_a |D_j\rangle_d \qquad (2)$$

where $D_j$ is the content of the jth memory cell.

It is possible to directly translate the addressing arrangements used for classical RAMs into the quantum realm (for example, see M. A. Nielsen and I. L. Chuang. *Quantum Computation and Quantum Information*, Cambridge University Press, Cambridge, 2000). In these translations, the n qubits of the index register coherently control n quantum control lines, each of which acts coherently on an entire level of the bifurcation graph. At each branch of the bifurcation graph, a 0 in the index register for that level shunts signals along the upper paths, and a 1 in the index register shunts signals along the lower paths. Each binary address in the index register is correlated with a set of switches that pick out the unique path through the graph associated with that address. A coherent superposition of addresses is coherently correlated, i.e. entangled, with a set of switches that pick out a superposition of paths through the graph.

To complete a quantum memory read access (the "write" operation is completely analogous), a quantum "bus" is injected at the root node and follows the superposition of paths through the graph. Then the internal state of the bus is changed according to the quantum information in the memory slot at the end of the paths (for example, via a controlled-NOT transformation that correlates the bus and the memory). Finally, in order to decorrelate the bus position from the index register, the bus returns to the root node by the same path. Like a quantum particle, the bus must be capable of traveling down a coherent superposition of paths. Although not impossible, such a qRAM scheme is highly demanding in practice for any reasonably-sized memory. In fact, to query a superposition of memory cells, the index register qubits are in general entangled with $O(N)$ switches or quantum gates (or, equivalently, they must control two-body interactions over exponentially large regions of space), that is, a state of the form:

$$\sum_j \psi_j |j_0 j_1 \ldots j_{n-1}\rangle_a \otimes |j_0\rangle_{s_0} |j_1\rangle_{s_1}^{\otimes 2} \ldots |j_{n-1}\rangle_{s_{n-1}}^{\otimes 2^{n-1}}$$

where $j_k$ is the kth bit of the index register, and $s_k$ is the state of the $2^k$ switches controlled by the kth bit of the index register. Such a gigantic superposition is highly susceptible to decoherence and requires costly quantum error correction whenever the error rate is bigger than $2^{-n}$. In fact, if a single gate out of the $N=2^n$ gates in the array is decohered, then the fidelity of the state in average is reduced by a factor of two, and if at least one gate in each of the k lines is decohered, the fidelity in average is reduced by $2^{-k}$.

The possibility of efficiently implementing a qRAM would yield significant advantages in many fields. For example, it would give an exponential speedup for pattern recognition algorithms (G. Schaller and R. Schutzhold, *Physical Review A*, 74:012303, 2006; R. Schutzhold. *Physical Review A*, 67:062311, 2003; C. A. Trugenberger. *Physical Review Letters*, 89:277903, 2002), period finding, discrete logarithm and quantum Fourier transform algorithms over classical data. Moreover, qRAMs are required for the implementation of various algorithms, such as quantum searching on a classical database (M. A. Nielsen and I. L. Chuang, *Quantum Computation and Quantum Information*, Cambridge University Press, Cambridge, 2000), collision finding (P. Høyer, G. Brassard and A. Tapp. *ACM SIGACT News (Cryptology Column)*, 28:14,1997), element-distinctness in the classical and quantum settings (A. Ambainis. *Proceedings 45th IEEE FOCS'04*, preprint quant-ph/0311001, 4393:598, 2004; A. W. Harrow, A. M. Childs and P. Wocjan. *Proceedings 24th Symposium on Theoretical Aspects of Computer Science (STACS 2007)*, *Lecture Notes in Computer Science*, 4393:598, 2007), and the quantum algorithm for the evaluation of general NAND trees (A. M. Childs et al. *Proceedings 48th IEEE Symposium on Foundations of Computer Science (FOCS'07)*, quant-ph/0703015, 2008). Finally, qRAMs permit the introduction of new quantum computation primitives, such as quantum cryptographic database searches (S. Lloyd, V. Giovannetti and L. Maccone. *Physical Review Letters*, 100, 230502, 2008) or the coherent routing of signals through a quantum network of quantum computers (S. Lloyd, V. Giovannetti and L. Maccone. unpublished, 2008).

SUMMARY

In accordance with the principles of the present invention, address signals are decoded in a "bucket brigade" address decoding architecture in which the address signals or bits are sequentially sent along the same address decoding path. The inventive architecture comprises a set of node switches linked into a binary tree. The address signals enter at the root node of the binary tree. As each address signal reaches an uninitialized node switch, it sets the path direction for that switch node so that subsequent address signals that follow the path will use that path direction. Even though the number of logic gates in the system remains by necessity exponential, only $O(n)$ of those gates need be activated in the course of a memory access. Therefore, a classical RAM that uses the bucket-brigade addressing scheme need only activate $O(n)$ transistors in the course of a memory access, in contrast a conventional RAM activates $O(2^n)$ transistors. As a result, a RAM that uses the inventive design can operate with less dissipation and power consumption than a conventional RAM. In a qRAM use of the inventive addressing architecture produces an exponential reduction in the number of gates that need to be entangled for each memory access, thereby simplifying the qRAM circuit with respect to the conventional architectures and reducing the need for expensive error correction routines.

In one embodiment of a "bucket-brigade" address decoder, the switches in the conventional address decoding circuitry are replaced by three-state switch nodes called "trits" in the discussion below that are disposed at the nodes of a bifurcation tree. The memory cells of the RAM are placed at the end of the bifurcation tree (as the leaves). The bits of the index register are then sequentially sent into the tree. Each bit interacts with one of the trits in such a way that it routes the following bits along branches of the tree that lead to the memory cell which that bit participates in addressing. After a path has been created a data signal is sent along the path to the selected memory cell.

In another embodiment, the trits are three-level quantum systems called "qutrits" and the index register sequentially sends qubits into the binary tree. After a path has been created, a quantum bus qubit is sent along the path to interact with the selected memory cell.

In yet another embodiment, each qutrit is an atom with a three-level structure and each qubit is encoded into a photon that traverses the binary tree structure.

BRIEF DESCRIPTION OF THE DRAWINGS

FIG. 1 is a block schematic of a conventional fanout addressing circuit for a classic RAM memory.

FIG. 2 is a schematic diagram of an electronic implementation of the circuit shown in FIG. 1.

DETAILED DESCRIPTION

The inventive "bucket-brigade" address-decoding architecture is based on sending both the index register bits and the information to be read or stored in the memory cells sequentially through the bifurcation graph. Like buckets of water passed along a line of improvised fire-fighters, the index register bits carve a route that crosses the whole graph along which route the information can subsequently be passed.

The bucket-brigade architecture uses $2^n$ switch nodes linked together in a conventional binary tree, but the switch nodes are different from the conventional switching elements. In particular, in each node of the binary tree, the conventional two-state switch is replaced by a three-valued memory element, called a "trit". As detailed below, most of the trits are in a passive state during a typical memory access. As a result, there is an exponential reduction of active gates and of two-body interactions, from $O(N)$ to $O(\log_2 N)$.

Figure 3:
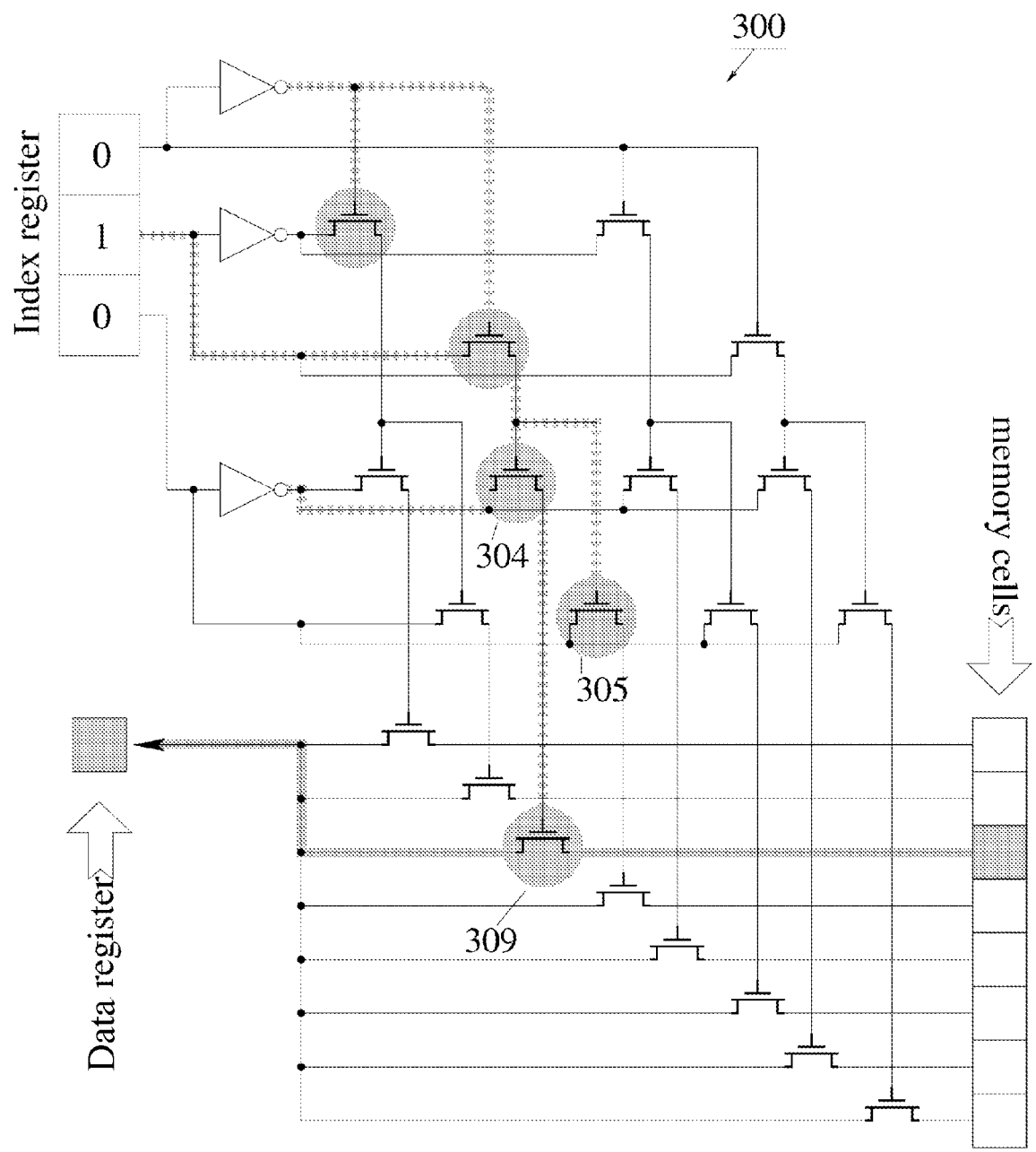
FIG. 3 is a modification of the conventional fanout circuit shown in FIG. 2 that reduces the number of transistors that must be activated during a memory access operation.
Figure 4A:
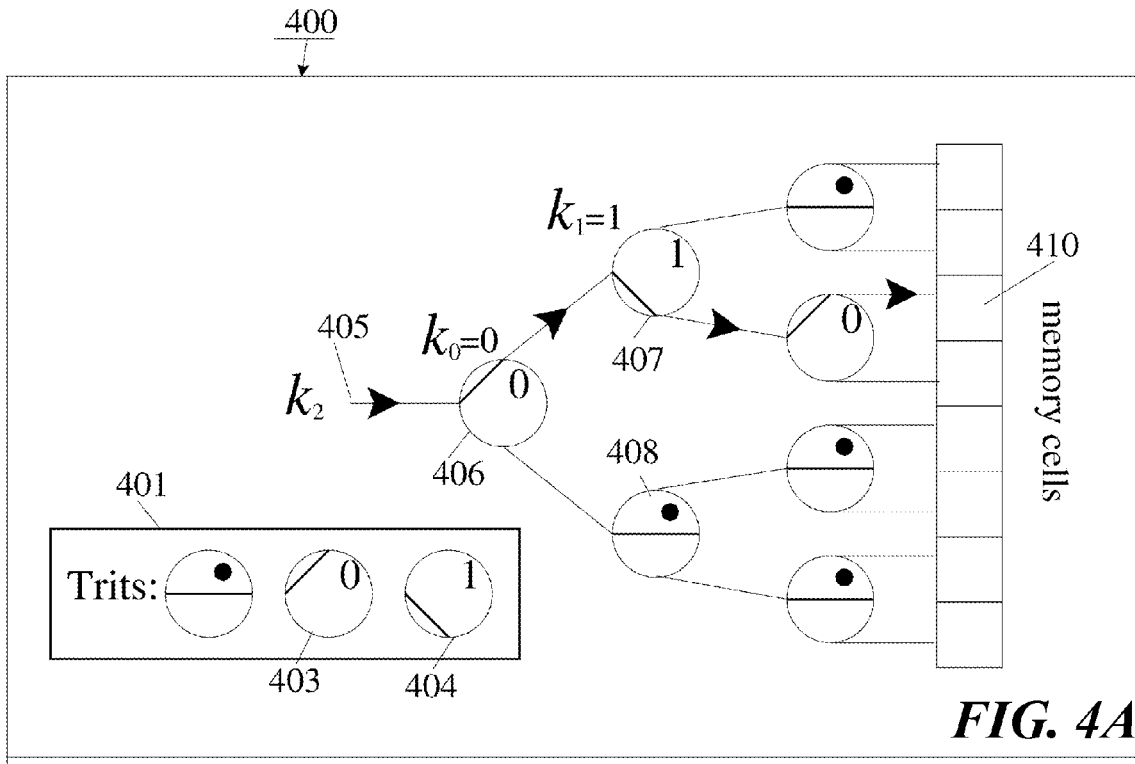
FIG. 4A is a block schematic diagram of a "bucket brigade" addressing scheme useful for addressing a classical RAM and constructed in accordance with the principles of the invention.

The basic "bucket-brigade" architecture is illustrated in FIG. 4A. At each node of the bifurcation graph there is a trit 401, whose three states are labeled "•" (a passive "ready" state), "0", and "1". A trit in state • will enter one of the 0 state and the 1 state based on the value of the incoming address bit. Once the trit enters either the 0 state or the 1 state, it remains in this state until the trit is reset. A trit in the 0 state will transfer any incoming bit received at its input to the upper path 403, whereas a trit in the 1 state will transfer incoming bit signals received at its input to the lower path 404.

A typical memory access starts by initializing all the trits to the ready state •. Then, the first bit of the index register is sent through the graph 405. It will encounter the root node 406 which is in the ready state •. Therefore, the incoming bit will cause the root node 406 to enter either its 0 state or its 1 state, depending on the value of the incoming address bit. The root node then remains in this state until it is reset. Next, the second bit of the index register is sent through the graph 405. Depending on the state of the first node 406, the incoming address bit will be transferred to the "up" path or the "down" path and will encounter one of the two nodes on the second level of the graph 407 or 408 respectively (both of which are in the ready state •). The encountered node will enter either its 0 state or its 1 state according to the bit value, and so on.

After all the log N bits of the index register have passed through the graph, a single route of n=log N trits in 0 or 1 states has been carved through the graph (for example, the path described by the thick arrows in FIG. 4A reaching the memory cell 410). All other trits remain in the passive ready state •. In the case of a memory write access, information or data to be stored can then be passed into the graph root node and follows the same path carved out by the address bits as represented by the state of the trits to the memory cell which is addressed by the index register. In the case of a read operation, the content of the accessed memory cell follows the established path back to the root node.

Figure 4B:
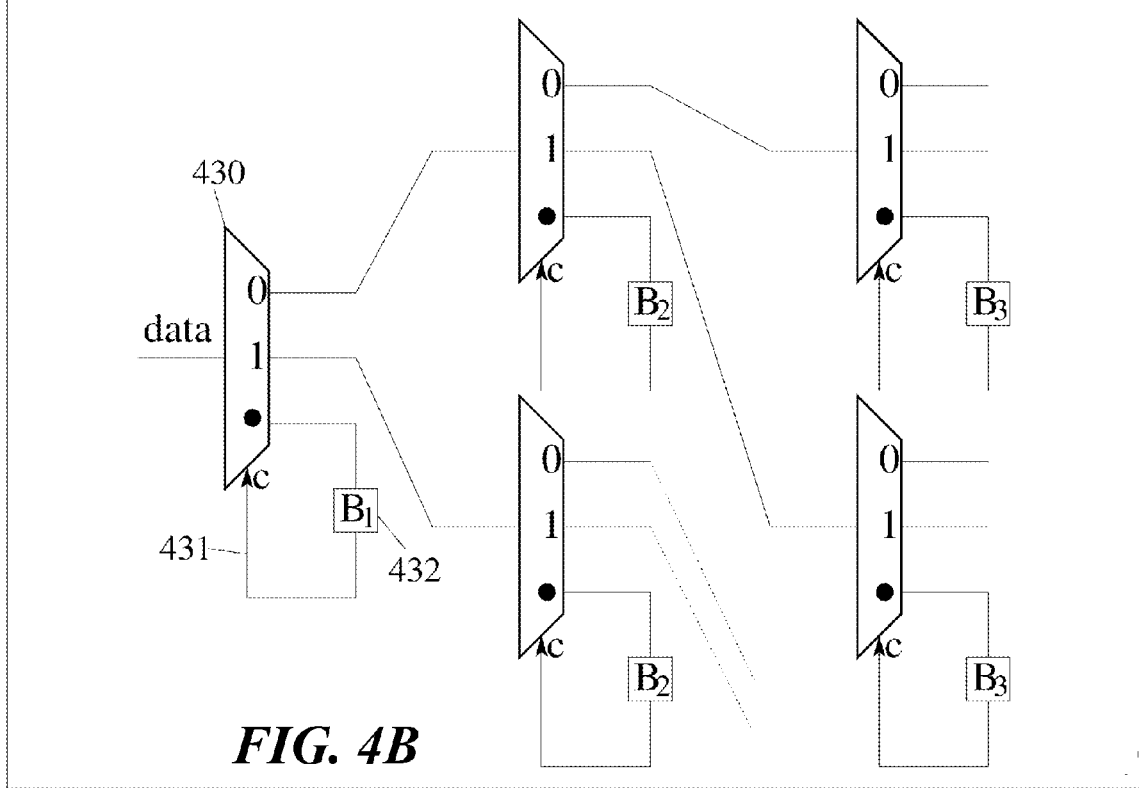
FIG. 4B is a schematic diagram of an electronic implementation of the bucket-brigade address decoder shown in FIG. 4A.

An illustrative example of an electronic implementation of the bucket-brigade is shown in FIG. 4B. The graph nodes are implemented with multiplexers 430 based on tristate logic elements (see P. Horowitz and W. Hill, *The art of electronics*, 2nd edition, Cambridge University Press, Cambridge, 1989). These elements route any incoming signal to the output determined by the input control line "c" 431. This control line is connected to a three-level memory element 432, whose input is determined by the multiplexer output related to the • ready state. The other two multiplexer outputs are connected to the multiplexers in the subsequent graph levels (or, in the last graph level, to the memory cells).

Initially all the memory elements $B_1$, $B_2$, etc. are in the ready state •. Any incoming signal is then routed to the memory element itself, which is switched to the value of the incoming signal. Any subsequent signal will be routed along one of the 0 or 1 paths depending on the value that had arrived previously. An internal clock or counter (not shown) resets all the memory elements to the state • after the 2n clock cycles necessary for the memory addressing, so that the circuit can restart.

The bucket-brigade architecture can also be extended to the quantum realm. In order to do this, the trits used in the classical architecture discussed above are replaced by "qutrits", that is, three-level quantum systems, described by the vectors $|\bullet\rangle$, $|0\rangle$ and $|1\rangle$. Now, when the qubits of the index register are sent through the graph, at each node they encounter a unitary encoding transformation U. If a qutrit is initially in the $|\bullet\rangle$ state, the unitary encoding transformation swaps the state of the qubit in the two $|0\rangle$-$|1\rangle$ levels of the qutrit (that is $U|0\rangle|\bullet\rangle=|f\rangle|0\rangle$ and $U|1\rangle|\bullet\rangle=|f\rangle|1\rangle$ where $|f\rangle$ is a fiduciary state of the qubit). If the qutrit is not in the $|\bullet\rangle$ state, then it simply routes the incoming qubit according to its state. It will coherently route the qubit to the upper path if it is in the state $|0\rangle$ and to the lower path if it is in the state $|1\rangle$. It is clear that an index register in a quantum superposition will carve a superposition of routes through the graph, so that any incoming qubit will travel through the graph in the corresponding superposition of locations.

Once all the register qubits are sent through the graph, a bus qubit is injected and reaches the end of the graph along the requested superposition of paths. The bus qubit then interacts with the memory cells at such locations changing its state according to their information content as described below.

Afterwards, the bus qubit is sent back through the graph, exiting at the graph's root node. Finally, starting from the last level of the graph, the qutrits are subject to the inverse of the unitary encoding transformation: a qutrit initially in the states $|0\rangle$ or $|1\rangle$ is evolved back to the state $|\bullet\rangle$, while sending a qubit (containing the state of the $|0\rangle$-$|1\rangle$ levels) back through the graph, that is, the transformation $U^\dagger|f\rangle|0\rangle=|0\rangle|\bullet\rangle$ or $U^\dagger|f\rangle|1\rangle=|1\rangle|\bullet\rangle$. In order to activate this transformation at the right moment, various embodiments are possible. The simplest embodiment entails activating a classical control over all the qutrits in each level of the tree, sequentially from the last level up to the root node. Alternatively, in another embodiment, n control qubits are sent along the superposed path, each qubit of which controls the unitary transformation $U^\dagger$ at one of the tree levels. A further embodiment entails introducing counters in each node, which activate the $U^\dagger$ unitary transformation after a level-dependent number of signals have transited. At the end, all qubits of the index register have been ejected from the graph, which is restored to its initial state of all qutrits in the $|\bullet\rangle$ state, yielding the transformation of equation (2) above.

In a manner similar to quantum computation with atomic ensembles, the noise resilience of the quantum bucket-brigade stems from the fact that in each branch of the superposition only log N qutrits are not in the passive $|\bullet\rangle$ state. In fact, for a query with a superposition of r memory cells, it is necessary to entangle only O(r log N) qutrits, as the state of the device is of the type:

$$\sum_j \psi_j |j_0\rangle_{t_0} |j_1\rangle_{t_1(j_0)} \cdots |j_{n-1}\rangle_{t_{n-1}(j_{n-2})} \otimes |\bullet\rangle_{t_{l_j}}$$

where $t_k$ represents the state of the one qutrit at the kth level to which qubits are directed by the qutrit which is not in a $\bullet$ state at the k−1 level, and where $l_j$ spans the other qutrits. Even if all of the qutrits are involved in the superposition, the state is still highly resilient to noise because if a fraction $\epsilon$ of the gates are decohered (with $\epsilon$ log N<1) then, on average, the fidelity of the resulting state is O(1−$\epsilon$ log N). This is compared to the ½ fidelity reduction in the conventional qRAM above. However, the exponentially larger number of $|\bullet\rangle$ states could give significant overall errors even if their individual error rates are much lower than those used in the left and right states.

Another, equivalent, way to think of the resilience of the qRAM in the face of noise and error is the following. If the memory index register is initially in a superposition of a large number, e.g., all, of the memory sites, then all pieces of the qRAM circuit will be used during the coherent memory call. Because the bucket-brigade scheme for calling a single memory involves only n qutrits, however, in each component of the superposition only n qutrits will be active. Such superpositions are typically highly robust in the face of noise and loss (see D. Felinto, S. V. Polyakov, S. J. van Enk, C. W. Chou, H. de Riedmatten and H. J. Kimble, *Nature,* 438:828, 2005; R. K. Olsson, B. Julsgaard, K. Hammerer I. Cirac, J. F. Sherson, H. Krauter and E. S. Polzik, *Nature,* 443:557, 2006).

Like cluster state quantum computation (R. Raussendorf and H. J. Briegel, *Physical Review Letters,* 86:5188, 2001), the bucket-brigade architecture only assumes the possibility of operating coherently on a small number O(log N) out of large number O(N) of first-neighbor connected quantum memory elements, and it does not require macroscopic superposition states composed of an exponentially large number of quantum gates. Candidate systems for bucket-brigade architecture qRAMs include optical lattices (E. Jan'e et al. *Quantum Inf. Comput.,* 3:15, 2003; E. Demler, L.-M. Duan and M. D. Lukin, *Physical Review Letters,* 91:090402, 2003), Josephson arrays (R. Fazio A. Romito and C. Bruder, *Physical Review B,* 71:100501(R), 2005), arrays of coherently coupled quantum dots, or strongly correlated cavity arrays (F. G. S. L. Brand, M. J. Hartmann and M. B. Plenio, *Nature Physics,* 2:849, 2006).

Figure 5:
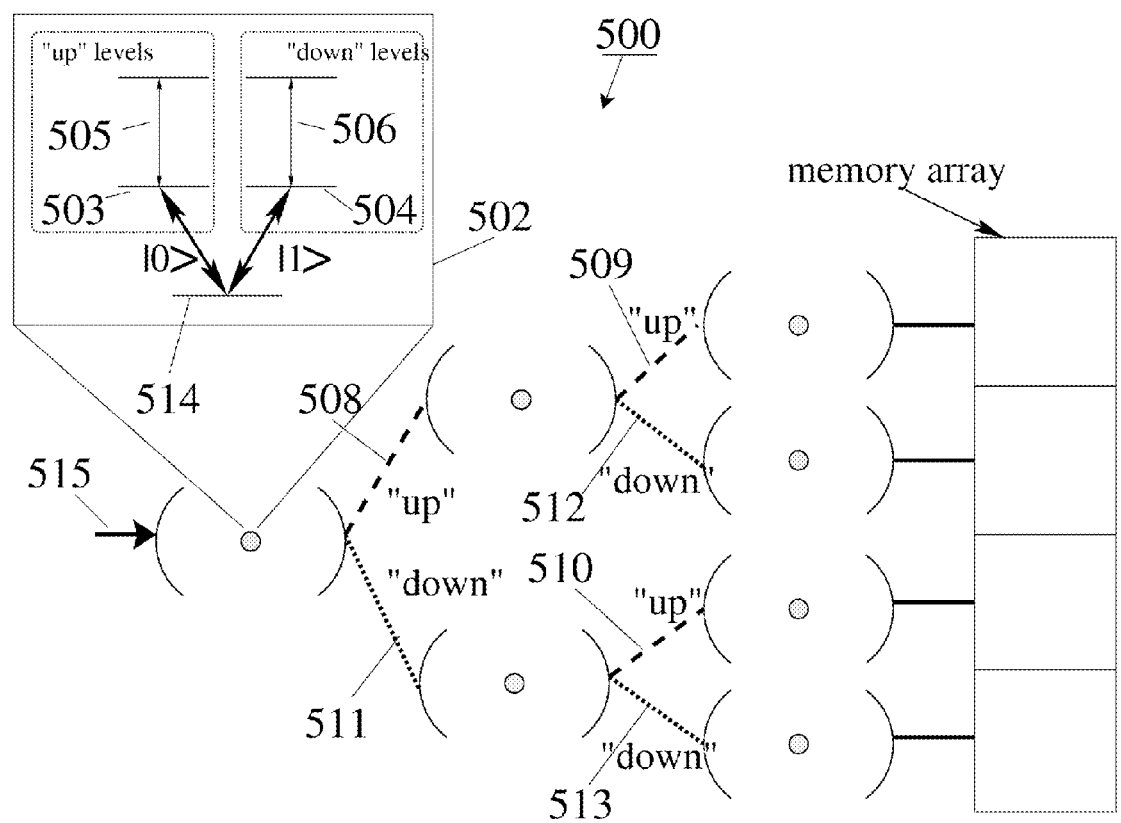
FIG. 5 is a schematic diagram is a block schematic diagram of a "bucket brigade" addressing scheme useful for addressing a quantum RAM and constructed in accordance with the principles of the invention.

FIG. 5 shows an illustrative physical implementation of the quantum bucket-brigade scheme where the index register qubits are encoded into photons propagating along a network of coupled cavities that contain trapped atoms. In each node of the binary tree, the qutrit is implemented by an atom with the level structure given in the inset 502 of FIG. 5. The "up" levels 505 are coupled to the "up" spatial paths in the tree (that is, the dashed lines 508, 509, and 510), while the "down" levels 506 are coupled to the "down" spatial paths (that is, the dotted lines 511, 512, and 513).

A memory access is started by preparing all atoms in the ground state level $|\bullet\rangle$ 514 and sending a photon to the input node 515 which encodes into its polarization state the first qubit of the index register. Alternatively polarization encoding can be replaced with time-bin encoding. By turning on a strong laser field to induce a Raman transition, the photon will be absorbed and stored in the first atom in the $|0\rangle$ atomic level 503 if it is in the state $|0\rangle$, and in the $|1\rangle$ level 504 if it is in the state $|1\rangle$. Then, a second photon which encodes the second qubit of the index register is sent into the binary tree. This photon will meet the atom in the state $|0\rangle$ or $|1\rangle$ depending on the value of the first qubit. Again, a Raman transition technique is used to absorb (and subsequently re-emit) the photon in the $|up\rangle$ level 505 or in the $|down\rangle$ level 506 respectively. In the first case (since $|up\rangle$ couples only to the "up" spatial path that connects to the subsequent level in the tree), the second qubit will move in the "up" path to the uppermost atom in the second node. Here it will be absorbed by the $|0\rangle$ or $|1\rangle$ levels 503 or 504 of the second atom, depending on its value. In the second case, instead, the qubit follows an identical evolution, but on the "down" path, reaching the lowermost atom in the second node.

Next, the third qubit of the index register is sent. It will follow a path along the first two bifurcations that is determined by the values of the first two qubits, and it will be absorbed in the $|0\rangle$ or $|1\rangle$ levels 503 or 504 of one of the atoms of the third node, thus determining the path that the fourth qubit will follow, and so on.

After all the qubits of the index register have been stored in the respective nodes, a bus photon initially in the state $|0\rangle$ is sent through the apparatus. Due to the presence of the other qubits stored in the respective atoms, the bus photon will be directed to the memory cell that is addressed by the index register, where the cell value will be copied onto some physical degree of freedom (for example, its frequency, its phase, or a time delay). Now this bus photon can follow the binary tree backwards, exiting with the memory cell value. To conclude the memory access, all the atoms are made to emit their stored qubits backwards with sequenced Raman transitions, starting from the last node and progressing to the first. The end result is that the memory cell's content has been stored on the bus qubit, while all the qubits of the index register have been re-emitted and are again available.

Because the bucket-brigade qRAM operates by sequential coupling of qutrits, it takes $O(n^2)$ steps to retrieve the contents of one of $2^n$ memory cells coherently. In the illustrative implementation, the nodes of the binary tree are atoms coupled via photons through Raman pulses. In other embodiments, the nodes could be solid-state artificial atoms such as superconducting qubits or electron spin quantum dots, for which a variety of tunable coupling schemes that allow the desired interactions have been designed (see, for example, A. M. Zagoskin, A. Blais, A. Maassen van den Brink, *Physical Review Letters,* 90:127901, 2003; J. E. Mooij, P. Bertet, C. J. P. M. Harmans. *Physical Review B,* 73:064512, 2006; J.-S. Tsai, A. O. Niskanen, Y. Nakamura. *Physical Review B,* 73:094506, 2006). All such embodiments will introduce errors, both via inaccuracies in the application of the classical fields required to induce interactions between qutrits, and via interaction with the environment. A key requirement is that the probability of passive states $|\bullet\rangle$ being inadvertently excited to active states $|0\rangle$, $|1\rangle$ be small enough that signals are not routed along the wrong path. Essentially, as long as the error rate is significantly less than one over the number of steps required in a memory call (i.e. $O(n^2)$) then the coherent memory call can be performed with high probability.

The quantum RAMs architectures discussed above (both the fanout and the bucket-brigade) do not require the information contained in the addressed memory cells to be classical. Indeed, the whole architecture still works also in the case in which the information stored in the memory cells is purely quantum. Of course in this case the no-cloning theorem forbids "copying" of the quantum data to the bus qubit (data register). Instead, the memory access will simply delocalize the information originally contained in the addressed memory cell into an entangled configuration of the cells and the data register. In fact, the procedure that copies classical information, i.e. the C-NOT gate, in general, will entangle quantum information on which it acts. Alternatively, a swap operation can be performed to transfer the quantum information to the bus. The bus can then transfer the quantum information out of the qRAM, at which point it can be sent to some desired destination. The type of quantum data processing that is implemented on the memory states of the qRAM depends on the desired application. Notice that, in contrast to the case of classical memory cells, a qRAM procedure based on either the swap or the C-NOT transformations will generally leave the memory array entangled with the index and data registers at the end of the procedure.

It is possible to reduce the number of circuit elements in all of the above implementations by using different geometric arrangements of the memory array. Typically, a bi-dimensional array is used, and the index register is divided into two parts, one of which indexes a row in the memory array, the other a column. If rows and columns have the same size, the number of necessary circuit elements can be reduced to the square root of its original value, and still address the same number of memory cells. More complex arrangements (such as using three- or four-dimensional memory arrays) would entail a further reduction of circuit elements, but are not typically used as they require much more complex wiring diagrams. In order to implement a decoding scheme for d-dimensional memory arrays, it is necessary to employ a separate decoding setup (which uses a fraction 1/d of the bits in the index register) for every edge of the array, i.e. two decoding graphs acting on n/2 bits of the index register for bidimensional arrays, three decoding graphs acting on n/3 bits for three-dimensional arrays, and so on.

While the invention has been shown and described with reference to a number of embodiments thereof, it will be recognized by those skilled in the art that various changes in form and detail may be made herein without departing from the spirit and scope of the invention as defined by the appended claims.

What is claimed is:

1. Address decoding apparatus for a random access memory having a plurality of memory cells, the apparatus receiving a plurality of address signals and selecting one of the plurality of memory cells based on the address signals and comprising:
    a plurality of switch nodes, wherein each switch node has an input and two outputs and three states including a ready state, a 0 state and a 1 state, and wherein, in the ready state, the switch node receives an address signal at the input and, based on a value of the received address signal, enters one of the 0 state and the 1 state, whereupon further signals received at the input are transferred to one of the two outputs based on the switch node state; and
    a plurality of links connecting the plurality of switch nodes into a binary tree structure having a root node for sequentially receiving each of the plurality of address signals and a plurality of leaf nodes, each of which is associated with two of the memory cells.

2. The apparatus of claim 1 further comprising an address register that transmits each of the plurality of address signals sequentially to the root node.

3. The apparatus of claim 2 further comprising a data register connected to the root node that transfers data between the root node and the selected memory cell after a path from the root node to the selected memory cell has been created by the address signals.

4. The apparatus of claim 3 further comprising a reset mechanism that resets all of the switch nodes to the ready state after data has been transferred between the root node and the selected memory cell.

5. The apparatus of claim 1 wherein each switch node comprises a multiplexer and a three-state memory.

6. The apparatus of claim 5 wherein each address signal comprises a bit signal.

7. The apparatus of claim 1 wherein each switch node comprises a three-level quantum system.

8. The apparatus of claim 7 wherein each address signal comprises a qubit.

9. The apparatus of claim 8 further comprising an address register that transmits a quantum superposition of address qubits to the root node.

10. The apparatus of claim 9 further comprising a data register connected to the root node that transfers a quantum bus qubit between the root node and the selected memory cell after a path from the root node to the selected memory cell has been created by the address signals.

11. The apparatus of claim 8 wherein each switch node comprises an atom with a three-level system.

12. The apparatus of claim 11 wherein each qubit is encoded into a photon that traverses the binary tree.

13. A method for decoding address signals for a random access memory having a plurality of memory cells, the method selecting one of the plurality of memory cells based on a plurality of address signals and comprising:
    (a) providing a plurality of switch nodes, wherein each switch node has an input and two outputs and three states including a ready state, a 0 state and a 1 state, and wherein, in the ready state, the switch node receives an address signal at the input and, based on a value of the received address signal, enters one of the 0 state and the 1 state, whereupon further signals received at the input are transferred to one of the two outputs based on the switch node state;
    (b) connecting the plurality of switch nodes into a binary tree structure having a root node for sequentially receiving each of the plurality of address signals and a plurality of leaf nodes, each of which is associated with two of the memory cells; and
    (c) transmitting each of the plurality of address signals sequentially to the root node.

14. The method of claim 13 further comprising:
    (d) transmitting data between the root node and the selected memory cell after step (c).

15. The method of claim 14 further comprising resetting all of the switch nodes to the ready state after step (d).

16. The method of claim 13 wherein each switch node comprises a multiplexer and a three-state memory.

17. The method of claim 16 wherein each address signal comprises a bit signal.

18. The method of claim 13 wherein each switch node comprises a three-level quantum system.

19. The method of claim 18 wherein each address signal comprises a qubit.

20. The method of claim 19 wherein step (c) comprises transmitting a quantum superposition of address qubits to the root node.

21. The method of claim 20 further comprising:
    (d) transferring a quantum bus qubit between the root node and the selected memory cell after step (c).

22. The method of claim 19 wherein each switch node comprises an atom with a three-level system.

23. The method of claim 22 wherein each qubit is encoded into a photon that traverses the binary tree.

* * * * *